(12) United States Patent
Droz

(10) Patent No.: US 7,710,732 B2
(45) Date of Patent: May 4, 2010

(54) ELECTRONIC MODULE COMPRISING AN ELEMENT EXPOSED ON ONE SURFACE AND METHOD FOR MAKING SAME

(75) Inventor: François Droz, La Chaux-de-Fonds (CH)

(73) Assignee: NagraID SA, Le Cret-Du-Locle (CH)

(*) Notice: Subject to any disclaimer, the term of this patent is extended or adjusted under 35 U.S.C. 154(b) by 903 days.

(21) Appl. No.: 10/529,774

(22) PCT Filed: Oct. 10, 2003

(86) PCT No.: PCT/IB03/04481

§ 371 (c)(1),
(2), (4) Date: Oct. 25, 2005

(87) PCT Pub. No.: WO2004/034320

PCT Pub. Date: Apr. 22, 2004

(65) Prior Publication Data

US 2006/0124350 A1 Jun. 15, 2006

(30) Foreign Application Priority Data

Oct. 11, 2002 (CH) .................................. 1690/02

(51) Int. Cl.
*H05K 7/00* (2006.01)
(52) U.S. Cl. .................. 361/728; 361/760; 361/761
(58) Field of Classification Search ............ 29/830, 29/832, 842, 846, 841; 361/728, 760, 761; 174/260–262
See application file for complete search history.

(56) References Cited

U.S. PATENT DOCUMENTS 5,026,452 A * 6/1991 Kodai .................. 156/293

(Continued)

FOREIGN PATENT DOCUMENTS

EP 1 085 459 A 3/2001

(Continued)

OTHER PUBLICATIONS

Partial translation of JP 62-290593 (previously submitted in Information Disclosure Statement of Dec. 4, 2008.).

*Primary Examiner*—Jinhee J Lee
*Assistant Examiner*—Andargie M Aychillhum
(74) *Attorney, Agent, or Firm*—Harness, Dickey & Pierce, P.L.C.

(57) ABSTRACT

A manufacturing method and an electronic module manufactured according to the method including an assembly with two insulating sheets and an electronic element. A first insulating sheet constituting one of the faces of the module including at least one window in which the electronic element is housed, one face of said element levelling the surface of said first sheet and appearing on the exterior face of the module. The second insulating sheet constitutes the other face of the module. The module includes an adhesive film which extends over a region covering at least the outline of the window of the element and is situated in a region situated between the first sheet and the second sheet. The module can also include at least one electronic circuit placed between the two insulating sheets and connected to the element on the conductive connection areas located on the interior face of the element.

22 Claims, 4 Drawing Sheets

U.S. PATENT DOCUMENTS

| | | | |
|---|---|---|---|
| 5,514,240 A | 5/1996 | Hagiiiri-Teiirani et al. | |
| 2002/0050527 A1 | 5/2002 | Nishikawa et al. | |
| 2005/0085005 A1* | 4/2005 | Droz .......................... | 438/106 |

FOREIGN PATENT DOCUMENTS

| | | |
|---|---|---|
| FR | 2 760 113 A | 8/1998 |
| JP | 62-290593 | 12/1987 |
| JP | 11-14494 | 5/1989 |
| JP | 03 114788 A | 8/1991 |
| JP | 05-208580 | 8/1993 |

\* cited by examiner

ELECTRONIC MODULE COMPRISING AN ELEMENT EXPOSED ON ONE SURFACE AND METHOD FOR MAKING SAME

BACKGROUND OF THE INVENTION

1. Field of the Invention

This invention belongs to the domain of electronic modules including an element visible on a face and the manufacturing methods of such a module. A module is understood as an assembly obtained by the stacking of laminated insulating layers having at least one window in which an element is inserted. The visible face of the element levels the exterior surface of the module face.

The visible element is defined here either as a fixed electronic component such as a visual display, a fingerprint sensor, a membrane switch, a contact module, a solar cell, a buzzer or any other similar element, or as a removable component such as a battery. This element can be connected to an electronic circuit situated between two layers of insulating material that constitute the module faces.

The electronic circuit situated inside the module is formed by one (such as an antenna) or several components connected to one another that serve to define the module functions. For example, in a module in the form of a payment card without contact, the circuit is formed by a chip connected to an antenna. Furthermore, it can be connected to a display visible on one of the faces of the card allowing the visualization of data contained in the chip such as the amount available or the debits carried out.

A module of this type is made up of the arrangement of an electronic circuit on a first sheet made from an insulating material and includes a window in which an electronic component is housed. The electronic circuit is then connected to the component then, in general, coated with a resin before laminating a second insulating sheet that will be stacked on the first. The module manufactured in this way is a sandwich made up of two insulating sheets between which the electronic circuit coated with binder is arranged. One face of the electronic component housed in the window appears on one of the exterior faces of the module.

2. Description of the Prior Art

For example the document FR 2760113 describes a manufacturing method of a combined card that can function with or without contact. The element that maintains the contacts is placed in a cavity formed by a window cut out of a substrate and with a bottom made up of an adhesive sheet on which the substrate is placed. An antenna is connected to the element conductive areas, then the assembly is covered with a binder before the application of an insulating protection film. The adhesive sheet on the first face of the card is removed at the end of the manufacturing process thus allowing the appearance of the contacts on the card surface.

According to this method, various manufactured modules are rejected during the final control of production because they include residues of filling resin close to the window where the electronic component is situated. In fact, for example, when the outline of the window is larger than that of the component, the resin fills the space left between the outlines of the window and the component and thus the resin can spill out over the exterior face of the module. In other cases, the structure of the component can contain grooves which the resin can infiltrate by capillary effect and contaminate the module surface. This type of module is discarded, or otherwise a supplementary cleaning operation would be necessary to eliminate the binding residue.

When the contact element constitutes an autonomous component, that is to say without connection to an antenna or to other components, it can be pressed in the profiled frame of a window formed in a substrate with a thickness at least equal to that of the component. The document JP03114788 describes a method for inserting a contact element in the substrate of a card that including a profiled window in such a way to hold the element on the surface of one of the faces of the card. The element is held in the window on the face opposite to the contacts by an insulating sheet provided with reliefs fitted onto the rear face of the element.

Another document EP1085459 describes a manufacturing method for a contact memory card where the contact element is inserted into a profiled frame formed in the first part of a substrate. A second flat substrate adhered to the first constitutes the bottom of a cavity delimited by the outline of the frame serving to support the contact element. The latter is inserted into the cavity in such a way that the contacts level the surface of the face of the first substrate.

SUMMARY OF THE INVENTION

The aim of this invention is to mitigate the above-mentioned drawbacks in order to reduce the rejection rate in production. Another aim is to minimise the manufacturing costs by increasing the speed of the process without adversely affecting the quality of the units.

The aim is achieved thanks to a manufacturing method for an electronic module including at least one insulating sheet on each of its faces and at least one element having a face that levels the surface of the exterior surface of the module, characterized by the following steps:

- placing a first insulating sheet on a work surface, said sheet includes at least one window in which an element will be housed,
- inserting the element into the window of the insulating sheet,
- stacking a protection film that extends over a region covering at least the outline of the window, said protection film is coated or made up of an adhesive substance active either at room temperature or activated under the effect of heat and/or pressure, said protection film is called adhesive film,
- laminating the previously formed assembly.
- stacking then laminating a second insulating sheet on the assembly formed by the first insulating sheet, the element and the protection film, said second insulating sheet constitutes the second face of the module.

The protection film is coated or made up of an adhesive substance which is activated either at room temperature (self-adhesive substance) or under the effect of heat and/or pressure. This protection film is later called adhesive film.

The first function of the adhesive film is to hold the element in the window during the handling of the assembly before proceeding to other manufacturing steps leading to the production of a completed module.

The assembly obtained in this way can be completed using a supplementary step which consists in directly laminating a second insulating sheet onto the adhesive film in order to form the second face of the module. The other possibility is to laminate a second assembly onto the first so that the faces including the element turn towards the exterior. The final module thus includes a visible element on each of its faces.

Depending on the thickness of the element, it is sometimes necessary to stack several insulating sheets provided with windows in order to form a stack having approximately the same thickness as that of the element. The adhesive film is thus placed on a surface that has been flattened before the lamination of the second sheet or of the second assembly.

According to a variant, the adhesive film can be sufficiently deformable to be applied onto an element thicker than the first insulating sheet. Supplementary insulating sheets are then stacked on this assembly in order to compensate for the thickness of the element.

The assembly can be completed with other steps when it is necessary to include an electronic circuit that can be connected to the visible element of the module. The circuit is placed in a zone near the window containing the element and is then connected to the element. A filling material is then distributed over the adhesive film, the insulating sheet and over the electronic circuit before the lamination of a second insulating sheet that covers the assembly.

In this case the second face of the element facing towards the interior of the module presents connection conductive areas allowing the soldering of conductors for the connection with the electronic circuit.

A module assembled according to this method does not present any filling material residue on the face of the element. The adhesive film blocks all leakage in the interstices present for example between the window outlines and the element.

According to a variant, the adhesive film can cover the whole surface of the first insulating sheet, including the window where the element is housed, and in this way prevent the infiltration of the filling material.

According to another preferred variant, the adhesive film includes a window opposite the electrical contacts arranged on the interior face of the element in such a way as to facilitate the soldering of the connections to the electronic circuit. The window dimensions are, for example, limited to the surface area of the element corresponding to the connection areas.

According to another variant, the first insulating sheet is provided with a cavity that will serve to place the electronic circuit in position. In a case where the adhesive film extends across the entire surface of the first sheet, it would take the form of the cavity which would allow the placement of the circuit. This embodiment is, in general, carried out when the predetermined final thickness of the module must be respected in the case where the thickness of the circuit is more important.

This invention also has as an object an electronic module including an assembly of two insulating sheets and an element, a first insulating sheet constituting one of the faces of the module and including at least one window in which the element is housed, one face of said element levelling the surface of said first sheet and appearing on the exterior face of the module, and the second insulating sheet constituting the other face of the module, characterized in that it includes an adhesive film which extends across a region covering at least the outline of the window of the element and being situated in a region included between the first sheet and the second sheet.

The element visible on the surface of the module can be replaced by an inert core in the module manufacturing process. Once the module is finished, the core is removed, leaving only a cavity with the form of the core previously inserted into one of the faces of the module. This cavity can be used for the subsequent insertion of a particularly fragile component that could not withstand the temperature or the pressure of the lamination process during the manufacture of the module. In one variant, the bottom of the cavity can be provided with contacts in the form of conductive surfaces connected to the electronic circuit. These contact conductive areas are arranged on the interior face of the core before the application of the adhesive film. They are held in the finished module by the filling material, the adhesive film and the connection with the circuit. Said cavity with contacts allows, for example, the insertion of a battery, a display, a sensor or any other component.

BRIEF DESCRIPTION OF THE DRAWINGS

The invention will be better understood thanks to the following detailed description which refers to the enclosed drawings which are given as a non-limitative example, in which.

DETAILED DESCRIPTION OF THE INVENTION

Figure 1:
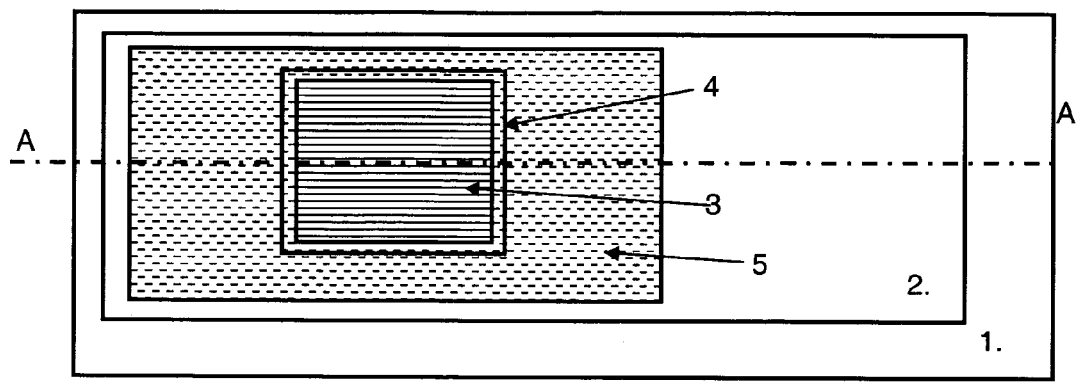
FIG. 1 represents a top view of a module with an element inserted in a window of the insulating sheet.

FIG. 1 shows a top view of an electronic module placed on a work surface (1) which includes an element (3) such as a display, a key, a contact module or also an inert core. The element is inserted into an opening or window (4) made in the insulating sheet (2) in plastic material, the outline of which is adapted to that of the element (3). The face of the element (3) in contact with the work surface is at approximately the same level as the exterior face of the module. An adhesive film (5) covers the window (4), the element (3) and an area of the insulating sheet (2) that extends around the window (2).

Figure 2:
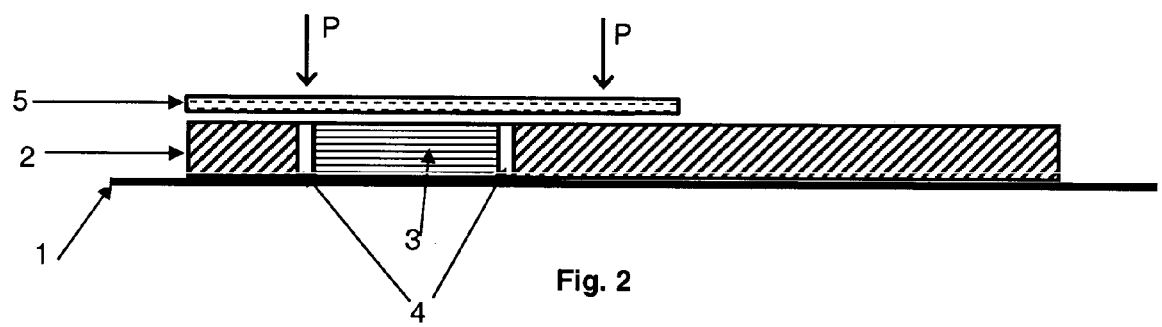
FIG. 2 represents a cross-section according to the A-A axis of the module in FIG. 1.

FIG. 2 represents a cross-section according to the A-A axis of the assembly in FIG. 1. The thickness of the insulating sheet (2) equals the thickness of the element (3) so as to obtain an approximately flat face after lamination by hot or cold pressing (P) the adhesive film (5).

Figure 3:
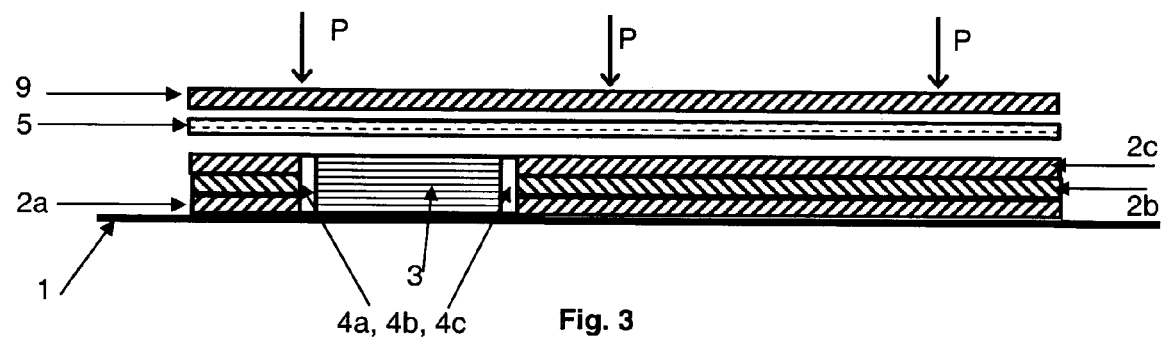
FIG. 3 shows a cross-section of a variant of the module in FIG. 1 with a stack of insulating sheets with a window.

According to a variant shown in FIG. 3, several insulating sheets (2a, 2b, 2c), each including a window (4a, 4b, 4c) can be stacked one on top of the other in order to obtain the desirable thickness according to that of the element (3). The outlines of the windows (4a, 4b, 4c) of each sheet (2a, 2b, 2c) coincide in such a way as to adapt to the outline of the element (3). The first sheet with a window (2a) constituting the exterior face of the module can include decoration or a marking. The adhesive film (5) is then placed on the stack (2a, 2b, 2c) in such a way as to cover at least the outline of the window (4c) of the last sheet (2c) of the stack. The adhesive film (5) can also extend across the entire surface of the sheet (2c). A second exterior sheet (9) without a window can then be directly laminated onto the adhesive film (5) to constitute the second face of the module that can also include decoration.

Figure 4:
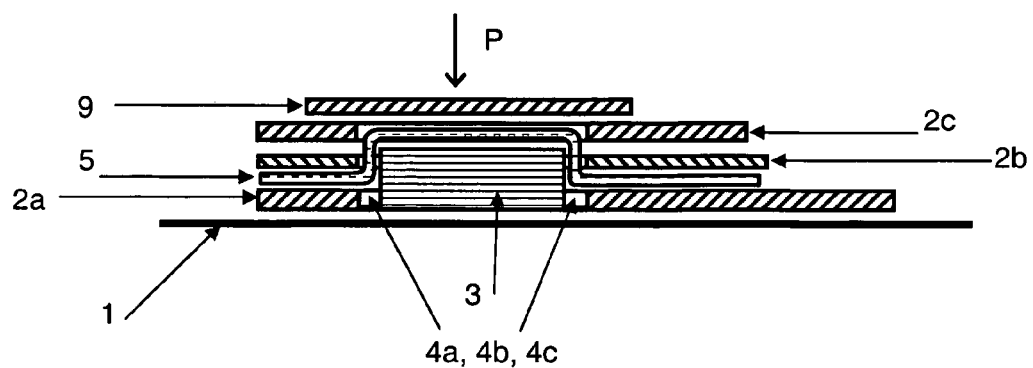
FIG. 4 shows a cross-section of a module variant in which supplementary sheets are stacked after the stacking of the adhesive film on the element.

FIG. 4 represents a variant with a thicker element (3) than the first insulating sheet (2a). A flexible and deformable adhesive film (5) is placed on the element in such as way to also extend over the peripheral area of the window (4a) of this first sheet (2*a*) where the element (3) is housed. Then the supplementary sheets (2*b*, 2*c*), each provided with a window (4*b*, 4*c*) whose outline coincides with the outline of the window (4*a*) of the first sheet (2*a*), are stacked. The thickness of this assembly is approximately the same as the thickness of the element (3). Finally a last sheet (9) without a window constituting the second face of the module is assembled on the stack, covering at least the interior face of the element (3). In this example, the main function of the adhesive film is to hold the element in the window of the first sheet in order to facilitate handling. In fact, this first assembly comprising insulating sheet with window—element—adhesive film (2*a*, 3, 5) can be transported to another location where the finishing works will be carried out, this consisting in the assembly of the other sheets (2*b*, 2*c*, 9) of the module.

Figure 5:
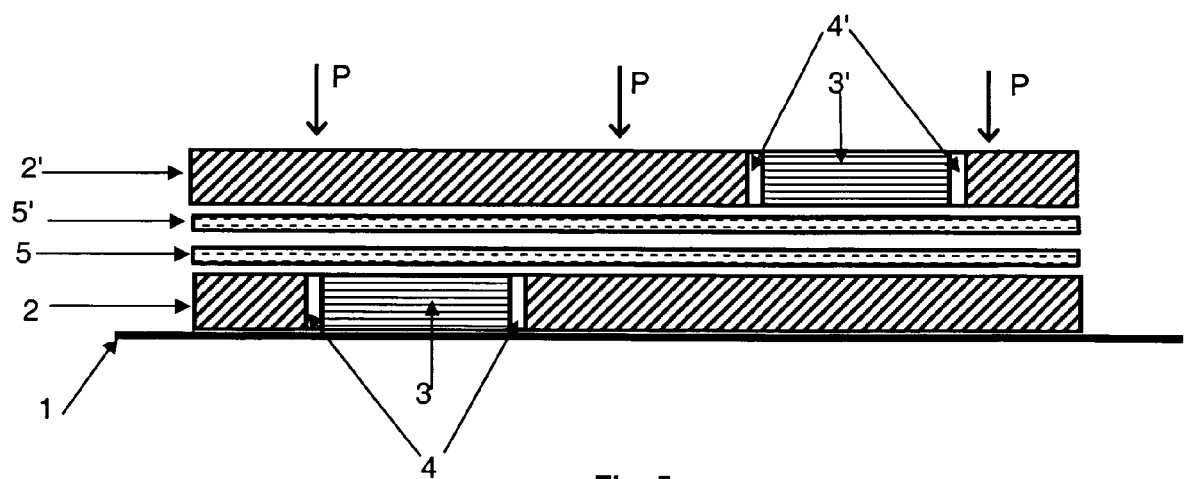
FIG. 5 shows a cross-section of the module that includes a visible element on each face.

FIG. 5 shows a module whose faces are provided with a visible element (3, 3') obtained through stacking, then by assembling using the adhesion of two assemblies including insulating sheet with window—element—adhesive film (2, 3, 5, 2', 3', 5'), the faces of each assembly provided with adhesive film (5, 5') remaining in contact.

Figure 6:
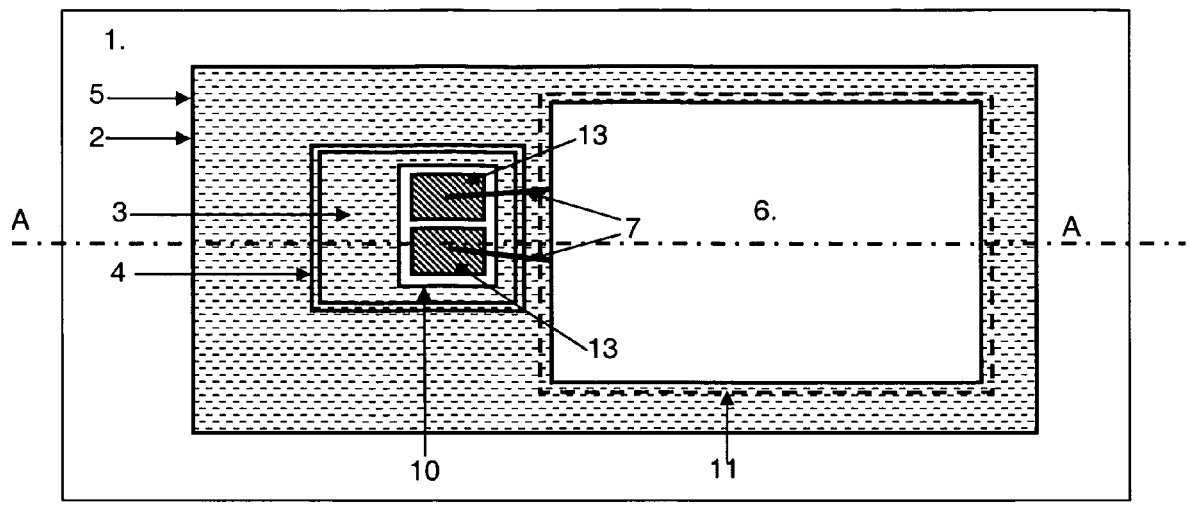
FIG. 6 represents a top view of a module including an electronic circuit before the application of the binder and the second insulating sheet.

FIG. 6 shows a view of the assembly of a module including an electronic circuit (6) connected to the element (3). On the work surface (1), the first insulating sheet (2) includes a window (4) where the element (3) is housed and is provided with two connection conductive areas (13) on its interior face. The exterior face of the element (3) like that of the insulating sheet (2) is in contact with the work table (1). The assembly formed by the element (3) and the insulating sheet (2) is entirely covered by the adhesive film (5) which is provided with a window (10) in the place where the connection conductive areas (13) of the element (3) are to be arranged. Therefore, these are released entirely to allow the soldering of the connections (7) originating from the electronic circuit (6) placed on the adhesive film (5).

According to the variant where the element (3) is made up of an inert core, conductive connection areas are separately placed on the interior face of the element before the adhesive film (5) is applied. These areas are then connected to the electronic circuit (6). When the module is completed, the core is removed and the bottom of the resultant cavity includes contacts. The latter allow the connection of an active component, of a similar form to the removed core, which will be subsequently inserted into the cavity. The component can either be removable like a battery, or fixed like a display, in the latter case it will be adhered and/or pressed into the cavity, the connections with the contacts being carried out by pressure or with a conductive adhesive for example.

According to another variant the electronic circuit (6) includes connections (7) that end on the internal face of the element (3) made up of an inert core so as to form contact areas on the bottom of the cavity when the core is removed.

Figure 7:
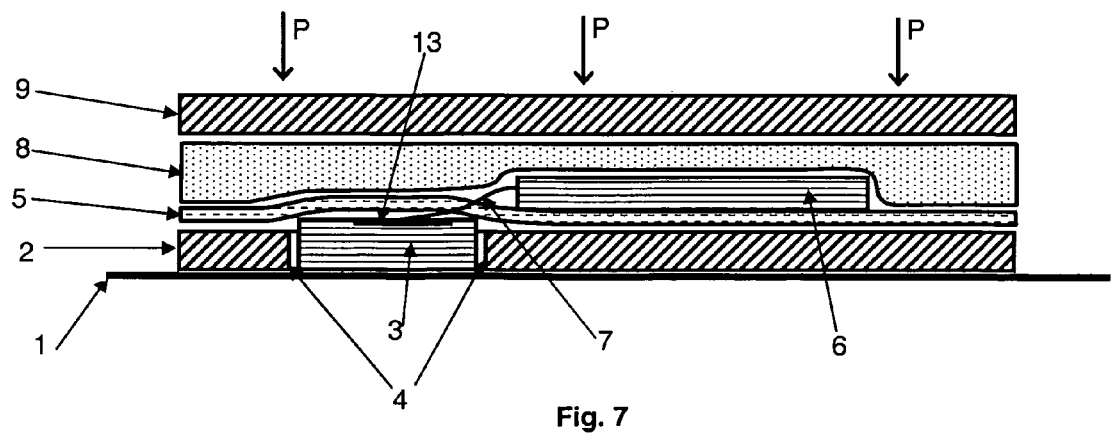
FIG. 7 represents a cross-section according to the A-A axis of the module in FIG. 5.

The cross-section in FIG. 7, according to the A-A axis, shows the stacking of the different elements of a module before pressing or lamination which are carried out according to the arrows P. The electronic circuit (6) is placed on the adhesive film (5) close to the window (4) in order to facilitate its connection to the element (3). This circuit (6) can also surround the element (3) if it deals for example with an antenna of any type connected to a chip, the latter would be placed next to the element. In other cases, parts of the circuit (6) can partially cover the element (3) when for example the surface available becomes small due to the large exterior dimensions of the circuit compared to those of the module. The position of the circuit (6) is maintained by adhesion on the adhesive film (5). A layer of filling material (8) is then distributed if necessary over all or part of the surface of the adhesive film (5) and the electronic circuit (6).

Filling material is understood to mean a substance in the form of a liquid or pasty resin, a thermo-fusible film or also a porous and flexible element that can be coated with an adhesive substance (foam, plastic material agglomerate). The function of said material is to fill in the holes and compensate the surface reliefs due to the assembly of the different elements of the module. According to its nature and its chemical composition this material is capable of solidifying, for example, under a cooling, heating or a UV radiation action.

Finally, a second insulating sheet (9) constituting the other face of the module is stacked and then pressed (P) onto the filling layer (8). Each of these insulating sheets (2, 9) can include a decoration on its exterior faces which also constitute the exterior faces of the module.

The manufacturing method of a module includes at least one element (3) having a first face that levels the exterior surface of the module, and a second face presenting the conductive connection areas (13) and an electronic circuit (6) is characterized by the following supplementary steps:

placing an electronic circuit (6) in a zone near the window (4) containing the element (3), connecting the connections areas (13) of the element (3) to the electronic circuit (6), distributing a layer of filling material (8) onto the adhesive film (5), on the first insulating sheet (2) and on the electronic circuit (6), stacking a second insulating sheet (9) on the layer of filling material (8), laminating the previously formed assembly.

This process begins with the three first steps relating to those of the manufacturing method of the module without the electronic circuit (6) as described above. The supplementary steps concern the placing of the circuit (6), its connection to the visible element (3) and coating with the filling material (8), thus assuring its protection and the maintenance of the module.

The adhesive film (5) has the double function of protecting the element (3) and the window (4) against the undesirable penetration of filling material (8), as well as to maintain the position of the electronic circuit (6) during the assembly of the module.

Figure 8:
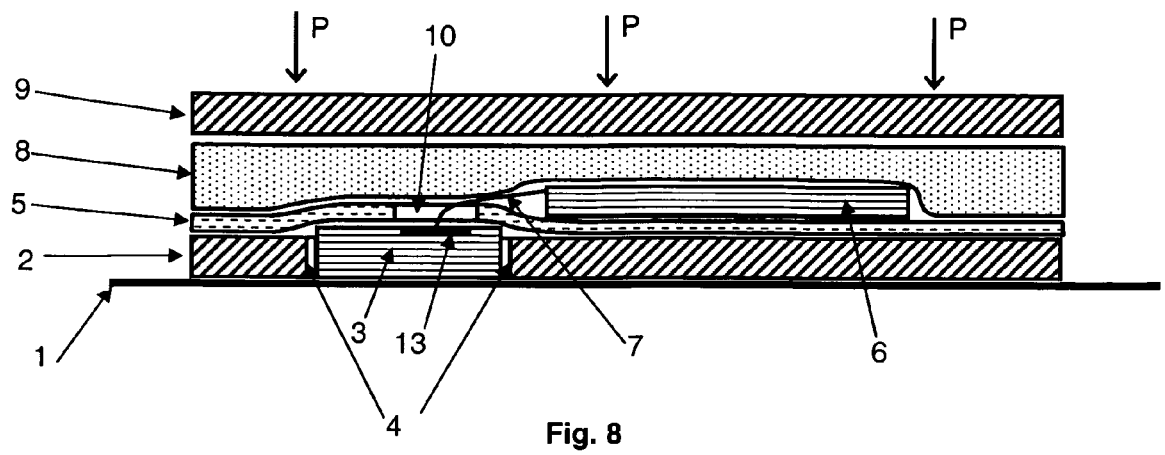
FIG. 8 shows a cross-section of a variant of the module in FIG. 5 with a window in the adhesive film.

FIG. 8 shows a variant where the adhesive film (5) includes a window (10) to be positioned opposite the conductive connection areas (13) of the element (3). The outline of the window (10) adapts to the outline of the areas of the interior face of the element (3) occupied by the connection areas (13). For example, the outline of the window (10) can surround a group of several contacts or surround each contact area individually. The aim of this window (10) is to leave the connection areas (13) free of any substance that could impede the soldering of the connections (7) in order to connect the element (3) to the electronic circuit (6). The window (10) is formed before the application of the adhesive film (5) onto the first insulating sheet (2) either by stamping or cutting, or by chemical etching.

According to the variant shown in FIG. 7 where the adhesive film (5) is without a window, welding is possible because certain materials constituting the adhesive film (5) evaporate completely due to the heat of the soldering process without leaving deposits on the connection areas (13).

Figure 9:
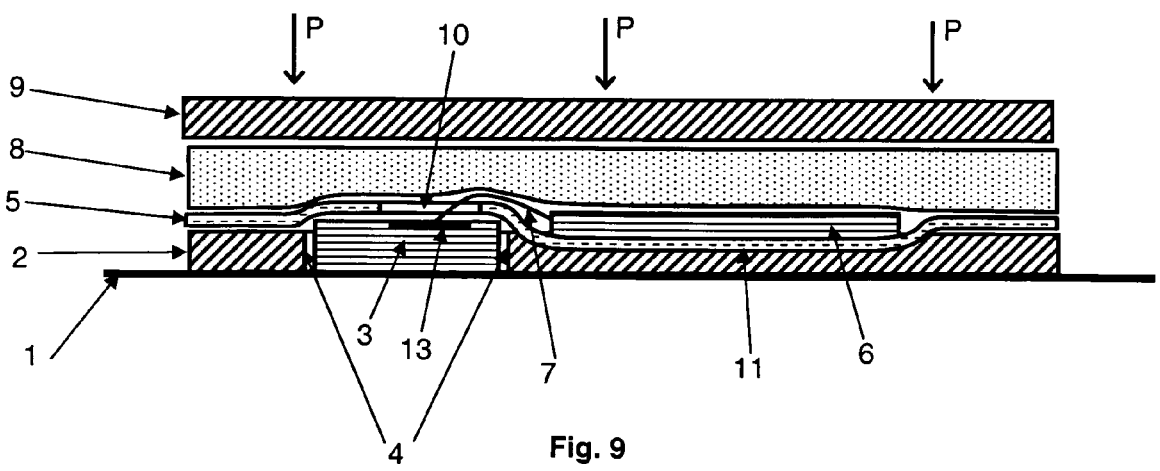
FIG. 9 shows a cross-section of a variant with a cavity in the first insulating sheet.

FIG. 9 shows a variant with a cavity (11) cut into the first insulating sheet (2), the outline of which adapts to that of the electronic circuit (6). This cavity is in general milled before or after the formation of the window (4) destined to receive the element (3). The depth of the cavity (11) depends on the thickness of the first sheet (2) and the thickness of the electronic circuit (6) which will be placed and adhered onto the adhesive film (5) which covers the bottom of the cavity (11). The final thickness of a module can be imposed by the application standards or restrictions, the cavity (11) allowing the integration of a thicker circuit (6) in the module without exceeding the predetermined dimension.

The cavity (11) can also be formed by one opening or the stacking of openings in one or various intermediate sheets (2b, 2c) stacked then laminated onto the first sheet (2, 2a). Each of these sheets also includes a window (4, 4a, 4b, 4c) for the element (3), see the example in FIG. 3.

According to a variant of the invention method, the adhesive film (5) can be placed in a first phase directly onto the work surface (1). The window (10) destined to free the connection areas (13) of the element (3) is then formed before placing in position the electronic circuit (6). The circuit film assembly is then transferred to another location where the first insulating sheet (2) provided with the window (4) containing the element (3) is applied. The steps for the connection of the element (3) to the circuit (6), providing the filling material (8) and lamination of the second insulating sheet (9) are carried out in the same way as the process previously described. This variant of the method allows the increase of the production speed thanks to the simultaneity of the first steps. For example, the stamping of the window (4) and the milling of the cavity (11) in the first insulating sheet (2) as well as the placement of the element (3) in the window (4) can be carried out at the same time as the stamping of the window (10) in the adhesive film (5) and the positioning of the electronic circuit (6) on the film (5).

The invention claimed is:

1. A method for manufacturing an electronic module including at least two insulating sheets defining its external faces, at least one element having a face flushing with an external surface of the module and an electronic circuit embedded between the two insulating sheets, comprising the steps of:
    placing at least one first insulating sheet including one window intended to lodge an element;
    inserting the element into the window of the first insulating sheet;
    stacking an adhesive protection film extending at least over a region between the element and the edges of said window, said adhesive protection film being coated or made up of an adhesive substance activated either at room temperature, or under the effect of heat and/or pressure, maintains the element in said window;
    placing an electronic circuit in an area close to the window containing the element;
    providing filling material on the set formed by the first insulating sheet, the element, the adhesive protection film and the electronic circuit;
    stacking a second insulating sheet on the filling material; and
    pressing or laminating the assembly previously formed, the filling material forming a layer compensating the surface relief due to the assembling of the electronic module.

2. The method of claim 1 wherein the outline of the window of the first insulating sheet adapts to the outline of the element.

3. The method of claim 1, wherein the element, lodged in the window, is thicker than the first insulating sheet, and In that several insulating sheets are stacked, with the outlines of the windows of each sheet coinciding, and the total thickness of the stack being substantially equal to the thickness of the element lodged in the windows of each sheet, the adhesive protection film being placed on the stack by covering at least the outline of the window of the last sheet of the stack.

4. The method of claim 1, wherein the element, lodged in the window, is thicker than the first insulating sheet and in that the adhesive protection film is placed on the element in such a way as to also extend over the outline of the window of said first sheet, supplementary sheets each provided with a window are stacked, the outline of the windows of each sheet coinciding with the outline of the window of the first sheet, and the thickness of the assembly of sheets is substantially equal to the thickness of the element.

5. The method of claim 1, wherein the element inserted in the window of the first insulating sheet is made up of an electronic component connected to the electronic circuit.

6. The method of claim 1, wherein the element inserted in the window of the first insulating sheet is constituted by an inert core intended to be removed at the end of the module manufacturing process, leaving a cavity having the shape of the core previously inserted on one of the faces of said module, said cavity being used for a subsequent insertion of a fixed or removable electronic component.

7. The method of claim 1, wherein the first insulating sheet includes a cavity, the outline of said cavity adapting to the outline of the electronic circuit placed in said cavity.

8. The method of claim 5, the element having a first face flushing with the external surface of the module and a second face presenting conductive connection areas, comprising a step of connection of the conductive connection areas of the element to the electronic circuit succeeding the step of placement of the electronic circuit.

9. The method of claim 5, comprising, prior providing the filling material, a step of placing conductive connection areas on the internal face of the element opposed to the face flushing with the external surface of the module, said conductive connections areas being than connected to the electronic circuit.

10. The method of claim 5, wherein the electronic circuit includes connections ending on the internal face of the element opposed to the face flushing with the external face of the module.

11. The method of claim 5, wherein, prior to the application of the adhesive protection film on the assembly formed by the first insulating sheet and the element, the electronic circuit is placed on said adhesive protection film and the assembly formed by the protection film and the electronic circuit is applied onto the assembly formed by the first insulating sheet and the element.

12. The method of claim 5 wherein the adhesive protection film includes at least one window facing the conductive connection areas of the element.

13. The method of claim 6 comprising, prior providing the filling material, a step of placing conductive connection areas on the internal face of the element opposed to the face flushing with the external surface of the module, said conductive connection areas being than connected to the electronic circuit.

14. The method of claim 6, wherein the electronic circuit includes connections ending on the internal face of the element opposed to the face flushing with the external face of the module, said connections forming conductive connection areas at the bottom of the cavity when the element is removed.

15. The method of claim 14, wherein the adhesive protection film includes at least one window facing the connection areas of the element.

16. An electronic module, comprising:

an assembly of at least two insulating sheets and at least one element, a first insulating sheet defining one of the faces of the module including at least one window in which the element is lodged, one face of said element flushing with the external surface of said first sheet the second insulating sheet constituting the other face of the module;

an electronic circuit embedded between the two insulating sheets in a layer of filling material; and an adhesive protection film extending over a region covering at least the outline of the window in which is lodged the element and situated between the first insulating sheet and the layer of filling material.

17. The electronic module of claim 16, wherein the internal face of the element opposed to the face flushing with the external surface of the module includes conductive connection areas connected to the electronic circuit.

18. The electronic module of claim 16, wherein the element inserted in the window of the first insulating sheet is constituted by an inert core intended to be removed leaving a cavity having the shape of the core on one of the faces of said module, said cavity being made to be used for the subsequent insertion of a fixed or removable electronic component.

19. The electronic module of claim 17, wherein the adhesive protection film includes at least one window facing the conductive connection areas of the element.

20. The electronic module of claim 18, wherein the bottom of the resulting cavity, after the element has been removed, includes conductive connection areas connected to the electronic circuit.

21. The electronic module of claim 19, wherein the external faces of the insulating sheets constituting the external faces of the module include a decoration or a marking.

22. The electronic module of claim 21, wherein the element is constituted by an electronic component.

* * * * *